(12) United States Patent
Schuele et al.

(10) Patent No.: US 7,238,554 B2
(45) Date of Patent: Jul. 3, 2007

(54) SIMULTANEOUS PLANAR AND NON-PLANAR THIN-FILM TRANSISTOR PROCESSES

(75) Inventors: Paul J. Schuele, Washougal, WA (US); Apostolos T. Voutsas, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 394 days.

(21) Appl. No.: 10/985,587

(22) Filed: Nov. 9, 2004

(65) Prior Publication Data

US 2005/0239238 A1 Oct. 27, 2005

Related U.S. Application Data

(63) Continuation-in-part of application No. 10/953,913, filed on Sep. 28, 2004, now abandoned, and a continuation-in-part of application No. 10/831,424, filed on Apr. 23, 2004, now Pat. No. 6,995,053.

(51) Int. Cl.
*H01L 21/00* (2006.01)

(52) U.S. Cl. .............................. 438/149; 257/E51.005; 257/E27.1

(58) Field of Classification Search ................ 438/149, 438/153, 154; 257/E51.005, E29.151, E27.1
See application file for complete search history.

(56) References Cited

U.S. PATENT DOCUMENTS 6,603,453 B2 * 8/2003 Yamazaki et al. ............ 345/92
6,960,787 B2 * 11/2005 Yamazaki et al. ............ 257/59

* cited by examiner

*Primary Examiner*—Thao P. Le
(74) *Attorney, Agent, or Firm*—Law Office of Gerald Maliszewski; Gerald Maliszewski

(57) ABSTRACT

A method is provided for concurrently forming MP-TFTs and P-TFTs. Generally, the method comprises: forming a P-TFT having source/drain (S/D) regions, an intervening channel region, and a gate, all in a first horizontal plane; and simultaneously forming a MP-TFT having a first gate in the first horizontal plane and at least one S/D region in a second horizontal plane, overlying the first horizontal plane. The vertical TFT (V-TFT) is an MP-TFT having vertical first gate sidewalls and a vertical channel region overlying a gate sidewall. The dual-gate TFT (DG-TFT) is an MP-TFT having a bottom gate, first and second S/D regions with top surfaces, an intervening channel region with a top surface, and a second, top gate with a bottom surface, all in a second horizontal plane, overlying the first horizontal plane.

16 Claims, 8 Drawing Sheets

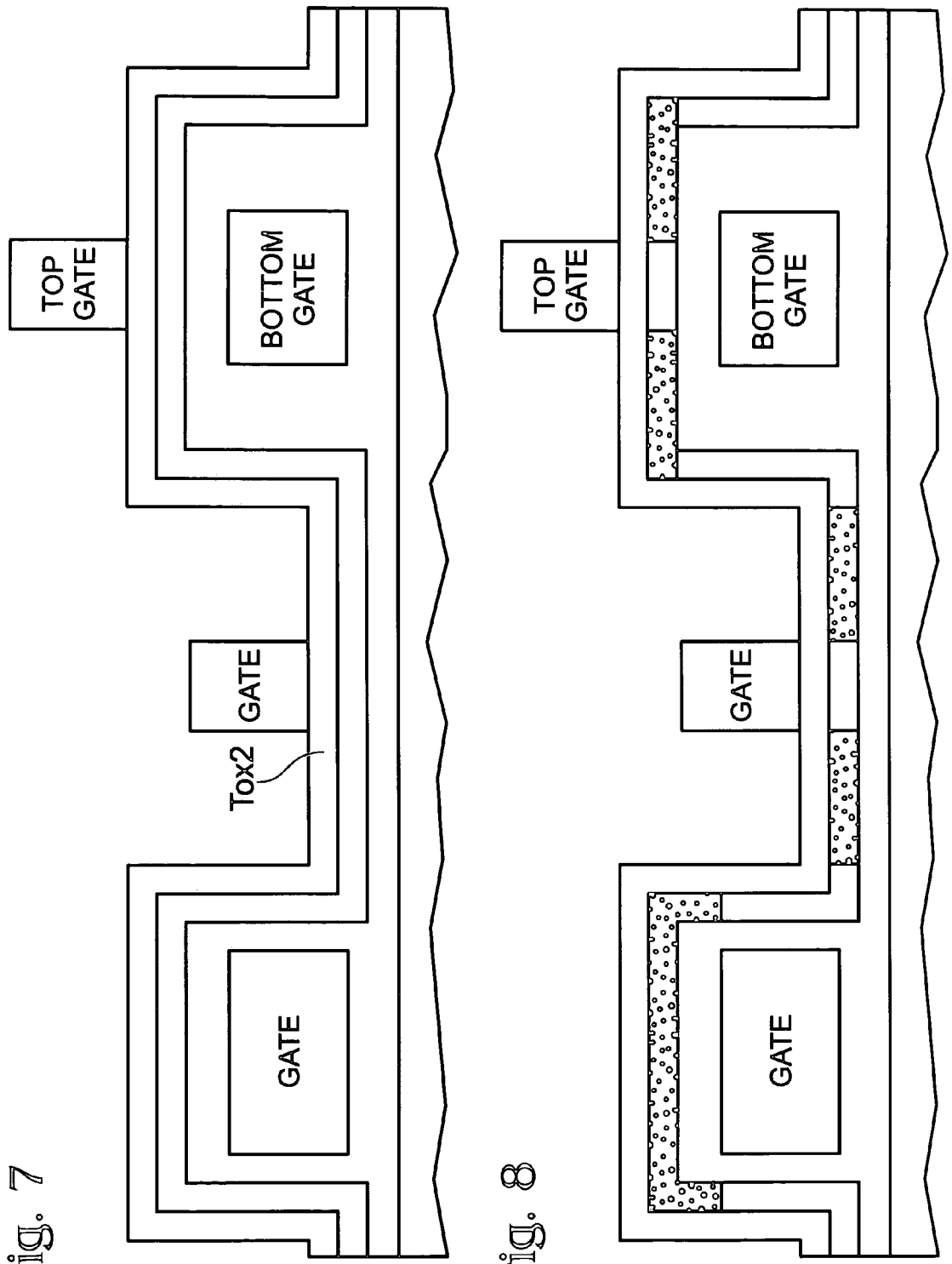

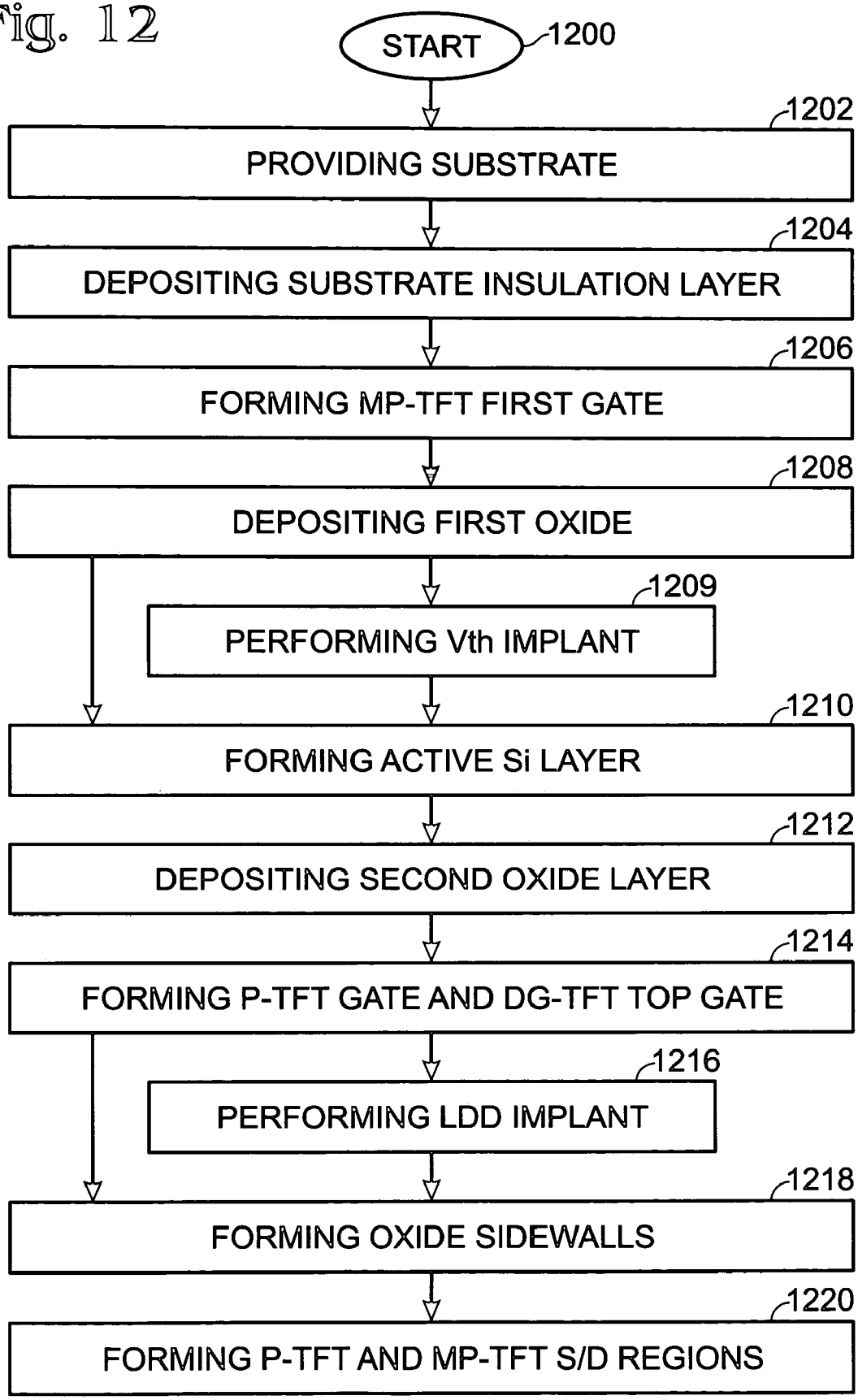

SIMULTANEOUS PLANAR AND NON-PLANAR THIN-FILM TRANSISTOR PROCESSES

RELATED APPLICATIONS

This application is a continuation-in-part of a patent application entitled, VERTICAL THIN FILM TRANSISTOR, invented by Schuele et al., Ser. No. 10/831,424 now U.S. Pat. No. 6,995,053, filed Apr. 23, 2004.

This application is a continuation-in-part of a patent application entitled, DUAL-GATE THIN-FILM TRANSISTOR, invented by Schuele et al., Ser. No. 10/953,913, filed Sep. 28, 2004 ABN.

BACKGROUND OF THE INVENTION

1. Field of the Invention

This invention generally relates to integrated circuit (IC) and liquid crystal display (LCD) fabrication and, more particularly, to a combination of planar and multi-planar thin-film transistors (TFTs) and a method for simultaneously fabricating planar and multi-planar TFTs.

2. Description of the Related Art

The size of TFTs formed in liquid crystal display (LCD) processes are limited by the resolution of large panel photolithography tools. Currently, the resolution of feature sizes is about 0.5 microns (um) and larger. High-speed circuit operation requires a TFT capable of high drive current and low parasitic capacitance. These characteristics are obtained by shrinking the device size, especially the transistor channel length. For example, conventional production CMOS technology uses transistor channel lengths of 90 nanometers (nm), and lower, for very high-speed operation.

FIGS. 1A and 1B are a schematic drawing and a plan view, respectively, of a conventional inverter circuit (prior art). The most basic logic element is an inverter, consisting of an N and P channel transistor as shown in FIG. 1A. A common arrangement for fabrication of an inverter circuit uses planar transistors is shown in FIG. 1B. These transistors have a channel length (L) equal to 0.8 microns. Note that the width of the P channel device is larger than the N channel device because of the higher drive current of N channel transistors. In most cases the P/N width ratio is about 2.

The above-mentioned Related Applications disclose two different types of multi-planar TFTs (MP-TFTs). A vertical TFT (V-TFT) has one source/drain (S/D) region in the same plane as the gate, as is conventional with a planar TFT (P-TFT), a second S/D region in a second plane overlying the gate, and a very short channel length formed along the sidewalls between the two S/D regions. A dual-gate TFT (DG-TFT) forms a bottom gate underlying the two S/D regions and channel region, and a top gate overlying the channel regions. The dual-gate control mechanism permits the threshold voltage to be more precisely controlled.

These devices address specific integration needs for next generation advanced displays. For example, advanced displays require the use of high-speed circuit functions involving image processing, voice recognition, wireless communication that can be directly (i.e. monolithically) integrated onto the substrate of the display itself. Monolithic integration becomes particularly appealing for the fabrication of novel display products featuring ultra-light, low-power consumption, and flexible characteristics.

Although these novel functions require novel device structures, certain basic display functions, such as pixel switching and power circuit architectures, can be best served by conventional device structures. For example, deep-sub-um P-TFT devices are known to be reliable when operated under high drain or gate voltages. Therefore, the co-integration of P-TFTs with MP-TFTs is desirable. This co-integration, ideally, can be made to occur without the addition of masking steps, which increase the manufacturing costs of display panels.

It would be advantageous if CMOS circuits in general and, more specifically, liquid crystal displays (LCDs) could be built using the two above-mentioned MP-TFTs, fabricated simultaneous with P-TFTs.

It would be advantageous if the above-mentioned P-TFTs and MP-TFTs could be fabricated using conventional CMOS processes.

SUMMARY OF THE INVENTION

This invention describes a method for co-integrating planar and MP-TFTs on a common substrate using conventional fabrication technology. With V-TFTs, the active channel length is controlled by the thickness of the gate layer deposition, rather than by patterning using photolithography and etching. As mentioned above, advanced V-TFTs can be used to fabricate fast, agile circuits that enable the monolithic integration of new, advanced functions on the display, such as on-board processing capability, memory function, input-output capabilities, and wireless communication ability, to name a few. At the same time, more conventional circuits, better served with planar devices, can still be fabricated with conventional device structures. Finally, a new device family, which results from this co-integration method, can be optionally fabricated to enable the modulation of the TFT threshold voltage for critical applications requiring precise Vth control.

Accordingly, a method is provided for concurrently forming MP-TFTs and P-TFTs. Generally, the method comprises: forming a P-TFT having source/drain (S/D) regions with top surfaces, an intervening channel region with a top surface, and a gate with a bottom surface, all in a first horizontal plane; and simultaneously forming a MP-TFT having a first gate with a bottom surface in the first horizontal plane and at least one S/D region with a top surface in a second horizontal plane, overlying the first horizontal plane.

The V-TFT is an MP-TFT having vertical first gate sidewalls and a vertical channel region overlying a gate sidewall. The DG-TFT is an MP-TFT having a bottom gate, first and second S/D regions, an intervening channel region, and a second, top gate, all in a second horizontal plane, overlying the first horizontal plane.

More specifically, the method comprises: providing a substrate; conformally depositing a substrate insulation layer overlying the substrate. The MP-TFT first gate is formed over the substrate insulation layer. A first oxide layer is deposited over the first gate and the substrate insulation layer. An active silicon layer is formed overlying the first oxide layer, and a second oxide layer is conformally deposited overlying the active Si layer.

In the case of a V-TFT, the first oxide layer overlying the V-TFT (first) gate sidewall is a gate oxide layer. A channel Vt adjust implant can be performed in the active Si layer overlying the first gate sidewall. In the case of the DG-TFT, the first gate is a bottom gate, and a second, top gate with sidewalls is formed overlying the second oxide layer-covered first gate. For P-TFTs, a gate with sidewalls is formed overlying the second oxide layer in a region adjacent the MP-TFT first gate.

When forming the V-TFT, oxide sidewalls are formed overlying vertical sections of the active Si layer that overlie the first gate sidewalls. With the DG-TFT, oxide sidewalls are formed overlying the vertical sections of the active Si layer that overlie the first gate sidewalls. Further, oxide sidewalls are formed overlying sidewalls of the second gate. The P-TFT gate sidewalls are also formed in this process.

Then, simultaneously with forming P-TFT S/D regions, a V-TFT first S/D region is formed in the active Si layer overlying the first gate, and a second S/D region is formed in the active Si layer adjacent the first gate. For the DG-TFTs, first and second S/D regions in the active Si layer, overlying the first gate and adjacent the second gate, are formed simultaneously with the P-TFT S/D regions.

Additional details of the above-described method and an IC fabricated from both multi-planar and planar TFTs are presented in more detail below.

BRIEF DESCRIPTION OF THE DRAWINGS

FIGS. 5 through 10 depict steps in the fabrication of the devices shown in FIG. 4.

FIG. 12 is a flowchart illustrating additional details of the method for concurrently forming MP-TFTs and P-TFTs.

DETAILED DESCRIPTION OF THE PREFERRED EMBODIMENTS

Figure 1A:
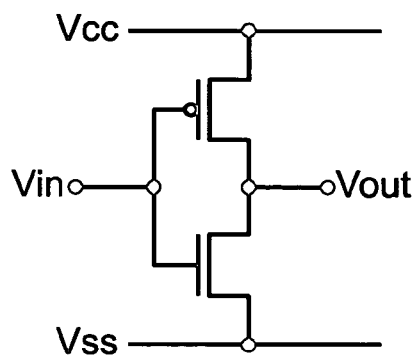
FIGS. 1A and 1B are a schematic drawing and a plan view, respectively, of a conventional inverter circuit (prior art).
Figure 1B:
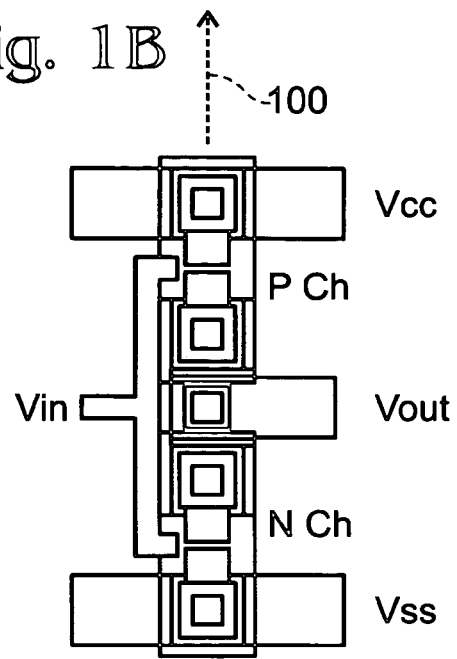
Figure 2A:
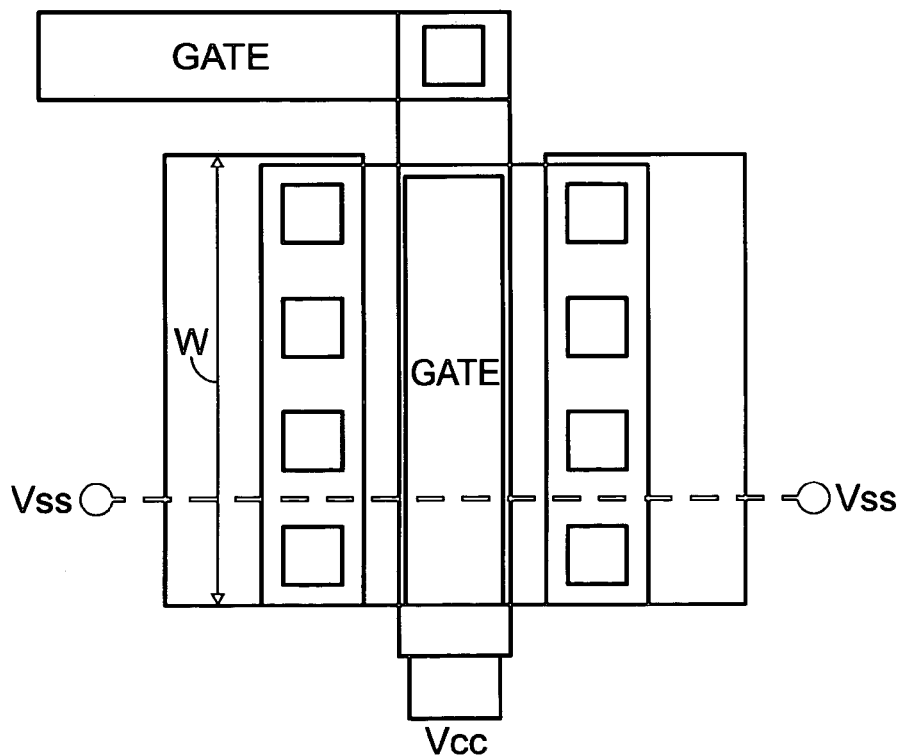
FIGS. 2A and 2B are plan and partial cross-sectional views, respectively, of a V-TFT.
Figure 2B:
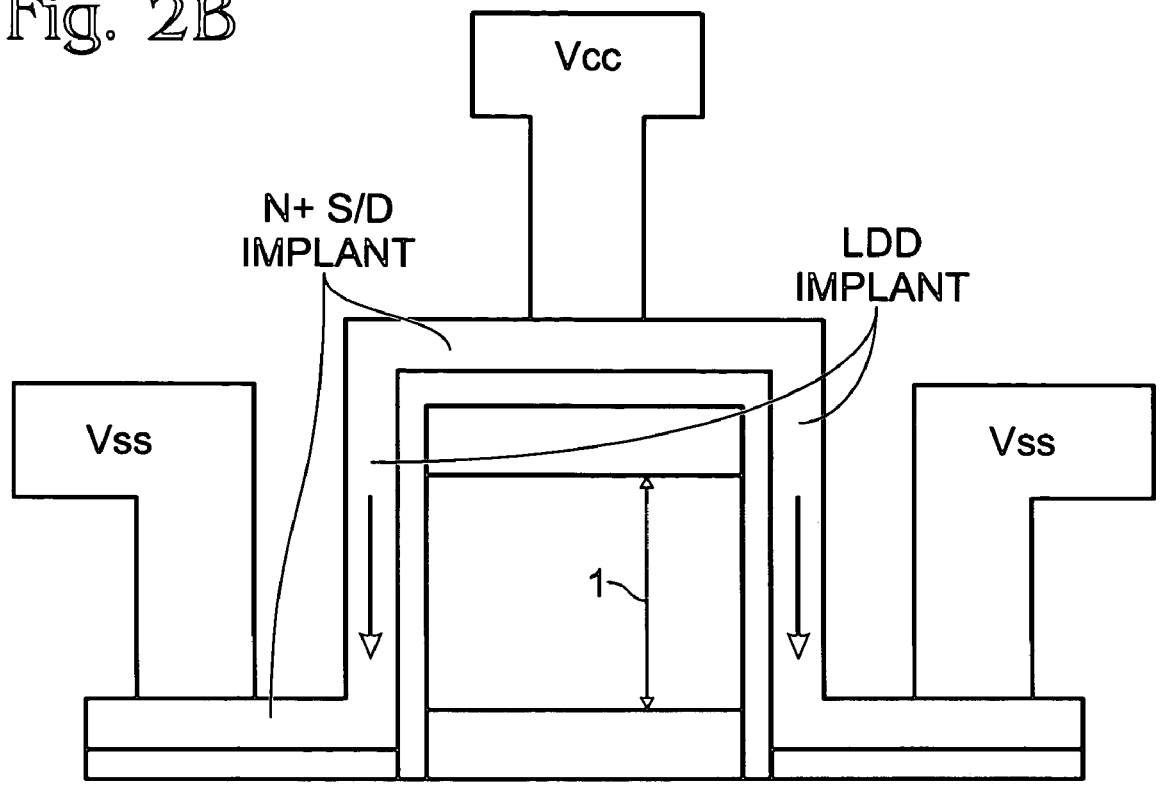

FIGS. 2A and 2B are plan and partial cross-sectional views, respectively, of a V-TFT. One version of a V-TFT can be an inverter circuit using an N and a P-channel V-TFT. One unique aspect of the V-TFT is that the transistor channel width is defined by the shape of the gate electrode, as well as by the active layer. In FIG. 2A it can be seen that the structure has two separate transistors of width W separated by the gate electrode. If the LDD implant is performed at the top of the structure, the high voltage (Vcc) terminal can be located over the gate, which is the center row of contacts in FIG. 2A. FIG. 2A shows two transistors with a common gate, and channel width determined by the width of the active layer (W), and length defined by the thickness of the gate electrode (L). These unique topologies permit the basic layout of logic elements, such as an inverter circuit, to be reconsidered. In FIG. 2B, current flow is marked by the arrows.

Figure 2C:
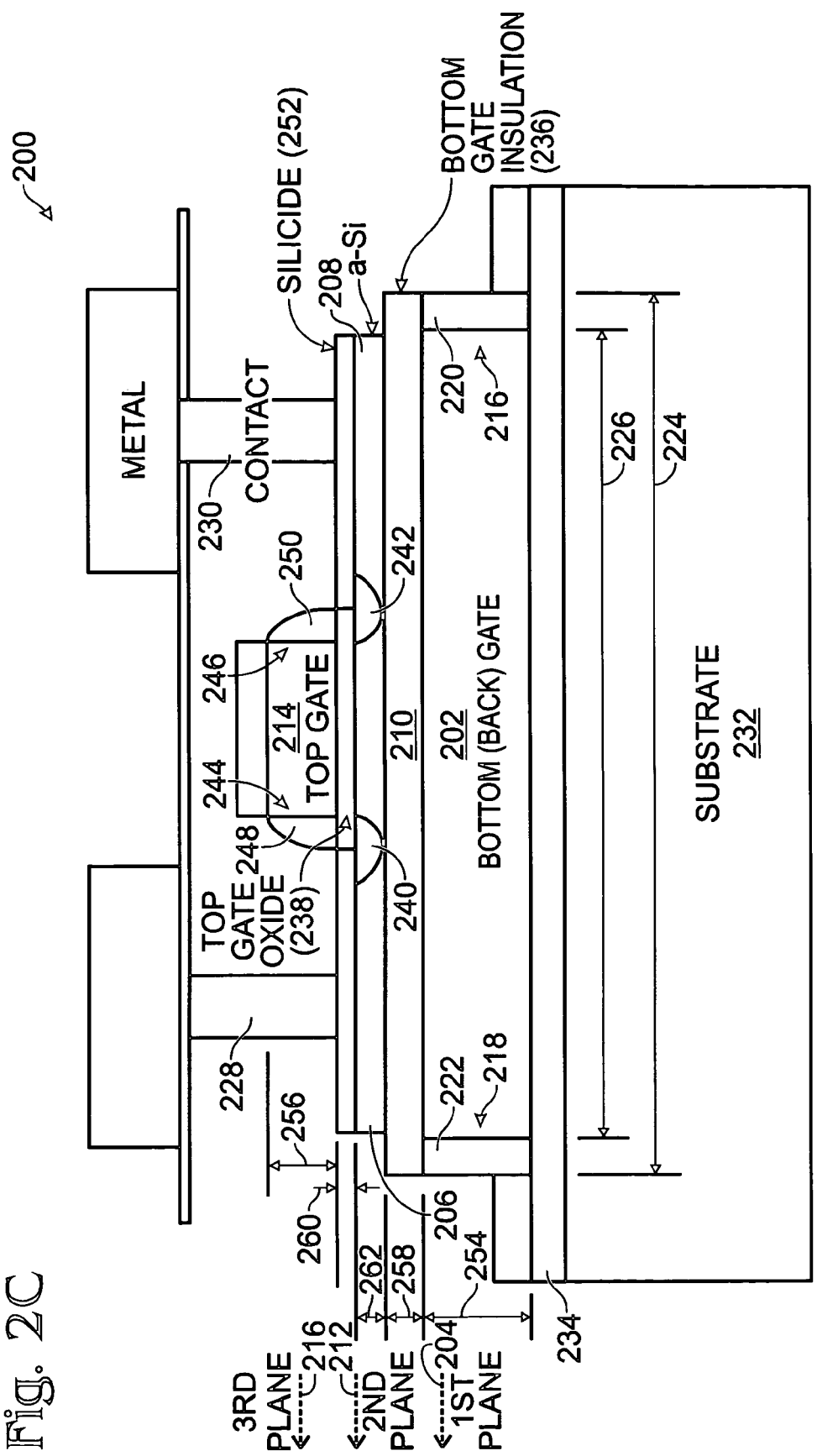
FIG. 2C is a partial cross-sectional view of a dual-gate thin film transistor (DG-TFT).

FIG. 2C is a partial cross-sectional view of a dual-gate thin film transistor (DG-TFT). The DG-TFT 200 comprises a first (back or bottom) gate 202 aligned in a first horizontal plane 204. A first polycrystalline silicon (poly-Si) source/drain (S/D) region 206, a second poly-Si S/D region 208, and an intervening poly-Si channel region 210 are aligned in a second horizontal plane 212, overlying the first plane 204. A second gate 214 is aligned in a third horizontal plane 216, overlying the second plane 212. Alternately, as used in the explanation of FIG. 3 below, the device may be considered to have two planes, where the first (S/D) region 206, a second S/D region 208, channel region 210, and second gate are all considered as aligned in the second horizontal plane 212

The horizontal planes can be defined in a number of ways. The element positions can be defined with respect to a top surface, bottom surface, or by approximate mid-height. As shown, the elements 202, 206, 208, 210, and 212 are defined as their mid-heights being in a specified plane. However, their positions can alternately be defined by top or bottom surfaces. Note, the term "horizontal" is used herein as a convenient visual reference. The planes need not actually be horizontal.

The first gate 202 has vertical sides 216 and 218. Insulating sidewalls 220 and 222 are shown over the first gate vertical sides 216/218, respectively. The first and second S/D regions 206 and 208 overlie the first gate 202, between the first gate vertical sides 216 and 218. The first gate 202 has a first gate length 224. The first S/D region 206, second S/D region 208, and intervening channel region 210 have a combined second length 226, smaller (shorter) than the first length 224.

Interlevel interconnects 228 and 230 are formed to the first and second S/D regions 206 and 208, respectively, overlying the first and second S/D regions 206 and 208. Thus, the interconnects 228 and 230 are also between (within the vertical boundaries formed by) the first gate sides 216 and 218.

Also shown is a substrate 232 made from a material such as Si, quartz, glass, or plastic. A substrate insulating (bottom isolation oxide) layer 234 overlies the substrate 232, and is made from a material such as SiO2, SiO2/Si3N4/SiO2, or organic insulators such as polyimide. However, the DG-TFT 200 is not limited to any particular substrate or substrate insulator material. The first gate 202 is formed overlying the substrate insulation layer 234.

A first (bottom) gate insulation layer 236 overlies the first gate 202. The first S/D region 206, second S/D region 208, and channel region 210 are formed over the first gate insulation layer 236. A second (top) gate oxide layer 238 overlies the channel region 210, and the second gate 214 is formed overlying the second gate insulation layer 238. The second gate oxide layer 238 can be made from the same list of materials as the substrate insulation layer 234, mentioned above.

In one aspect, lightly doped drain (LDD) areas 240 and 242 are formed in the first and second S/D regions 206 and 208, respectively. In another aspect, the second gate 214 has vertical sides 244 and 246, with oxide spacers 248 and 250 over the second gate vertical sides 244 and 246, respectively. For example, oxide spacers 248 and 250 may be useful, protecting the second gate 214, if silicide 252 is formed overlying the first and second S/D regions 206 and 208.

In one aspect, the first gate 202 has a thickness 254 in the range of 1000 to 3000 Å and the second gate 214 has a thickness 256 in the range of 1000 to 3000 Å. The first gate insulation layer 236 may have a thickness 258 in the range of 200 to 1000 Å. Likewise, the second gate oxide layer 238 has a thickness 260 in the range of 200 to 1000 Å. The first S/D region 206, second S/D region 208, and intervening channel region 210 may have a thickness 262 in the range of 300 to 1500 Å. However, the DG-TFT 200 is not necessarily limited to just the above-mentioned thicknesses.

Figure 3:
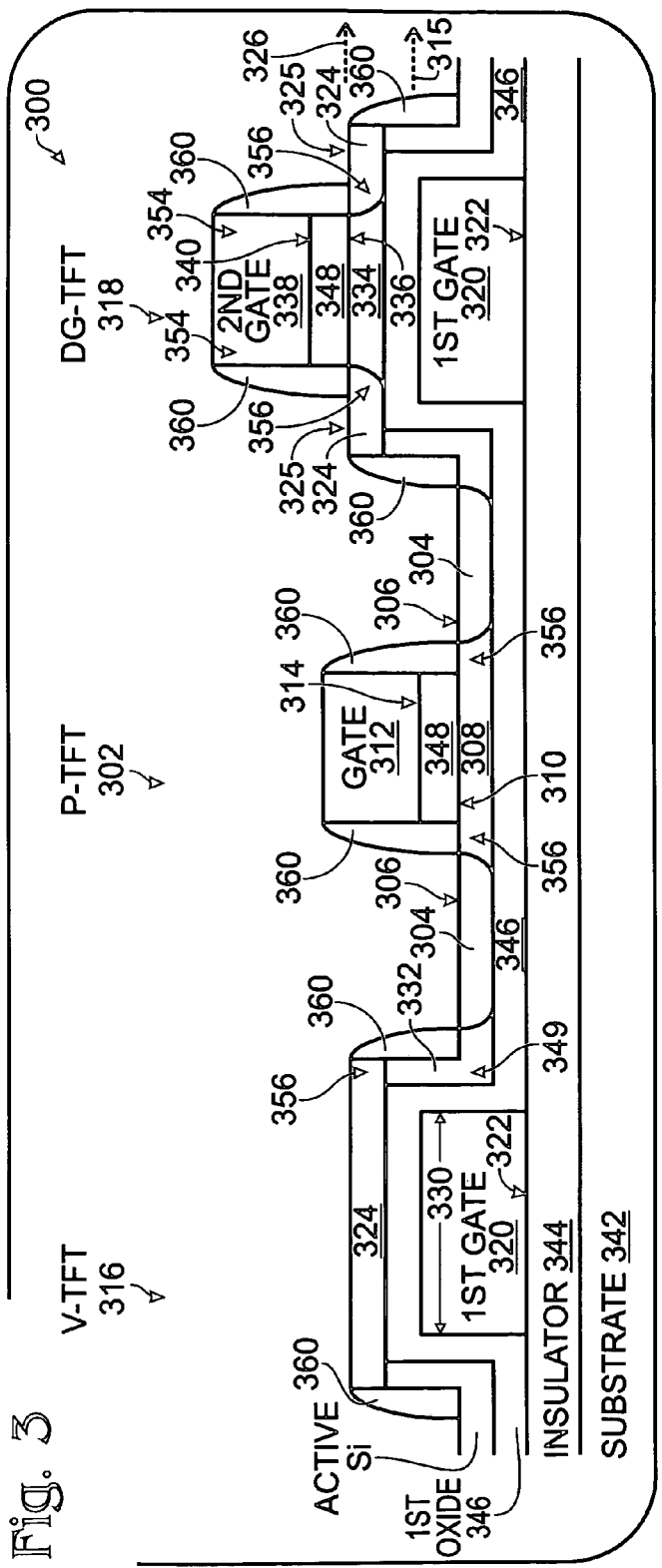
FIG. 3 is partial cross-sectional view of an integrated circuit (IC) with MP-TFTs and P-TFTs.

FIG. 3 is partial cross-sectional view of an integrated circuit (IC) with MP-TFTs and P-TFTs. The IC 300 comprises a P-TFT 302 having source/drain (S/D) regions 304 with top surfaces 306, an intervening channel region 308 with a top surface 310, and a gate 312 with a bottom surface 314. All the above elements can be considered to be oriented in a first horizontal plane 315. For this reason, the device 302 is conventionally referred to as planar, or co-planar.

A MP-TFT is shown adjacent the P-TFT 302. More specifically, two versions of an MP-TFT are shown, a V-TFT 316 and a DG-TFT 318. The MP-TFTs 316/318 both have a first gate 320 with a bottom surface 322 in the first horizontal plane 315. They also have at least one S/D region 324 with a top surface 325 in a second horizontal plane 326, overlying the first horizontal plane 315. The V-TFT 316 has one S/D region 324, and the DG-TFT 318 has two S/D regions 324 in the second horizontal plane 326.

As described above, the V-TFT 316 has vertical first gate sidewalls 330 and a vertical channel region 332 overlying a gate sidewall 330. In some aspects (not shown), a channel region may overlie both sidewalls 330. With respect to the DG-TFT 318, the first gate 320 is a bottom gate. The DG-TFT 318 has first and second S/D regions 324 with top surfaces 325, an intervening channel region 334 with a top surface 336, and a second, top gate 338 with a bottom surface 340. All the above-mentioned elements are located in the second horizontal plane 326, overlying the first horizontal plane 315. The MP-TFT S/D regions 324 and channel regions 332 and 334, as well as P-TFT S/D regions 304 and channels region 308 may be formed from a crystallized active Si layer.

The IC 300 further comprises a substrate 342, made from a material such as silicon (Si), quartz, glass, or plastic, and a substrate insulation layer 344 overlying the substrate 342. The substrate insulation layer 344 can be made from a material such as SiO2, SiO2/Si3N4/SiO2, or organic insulators such as polyimide. The MP-TFT first gate 320 is formed overlying the substrate insulation layer 344. A first oxide layer 346 overlies the MP-TFT first gate 320 and underlies S/D regions 304 and the channel region 308 of the P-TFT gate 312. A second oxide layer 348 overlies the DG-TFT first gate 320 (forming the second gate oxide layer) and underlies the P-TFT gate 312, forming the P-TFT gate oxide layer.

In the case of the V-TFT 316, the first oxide layer 346 overlies gate sidewalls 330 of the V-TFT first gate to form a first gate oxide layer. In some aspects, a channel Vt adjust implant 349 is performed in the active Si layer of the V-TFT overlying the first gate sidewall 330.

In the case of the DG-TFT, the first gate 320 is a bottom gate, and the DG-TFT 318 further includes a second, top gate 338 with sidewalls 354 overlying the second oxide-covered first gate 320.

In some aspects, a lightly doped drain (LDD) implant 356 is performed in active Si regions adjacent the P-TFT gate 312. Likewise, a LDD implant 356 can be performed in active Si layer regions overlying the V-TFT first gate 320 and in at least one active Si region adjacent the first gate 320. With respect to the DG-TFT 318, a LDD implant 356 can be performed in active Si layer regions overlying the first gate 320 and adjacent the second gate 338.

As shown, oxide sidewalls 360 are typically formed overlying sidewalls of the P-TFT gate 312. Simultaneously, oxide sidewalls 360 may be formed over the DG-TFT second gate 338. Oxide sidewalls 360 can also be formed over the V-TFT channel region 332. In some aspects (not shown), the oxide sidewalls over the V-TFT gate 320 may be the second oxide layer 348.

Functional Description

Figure 4:
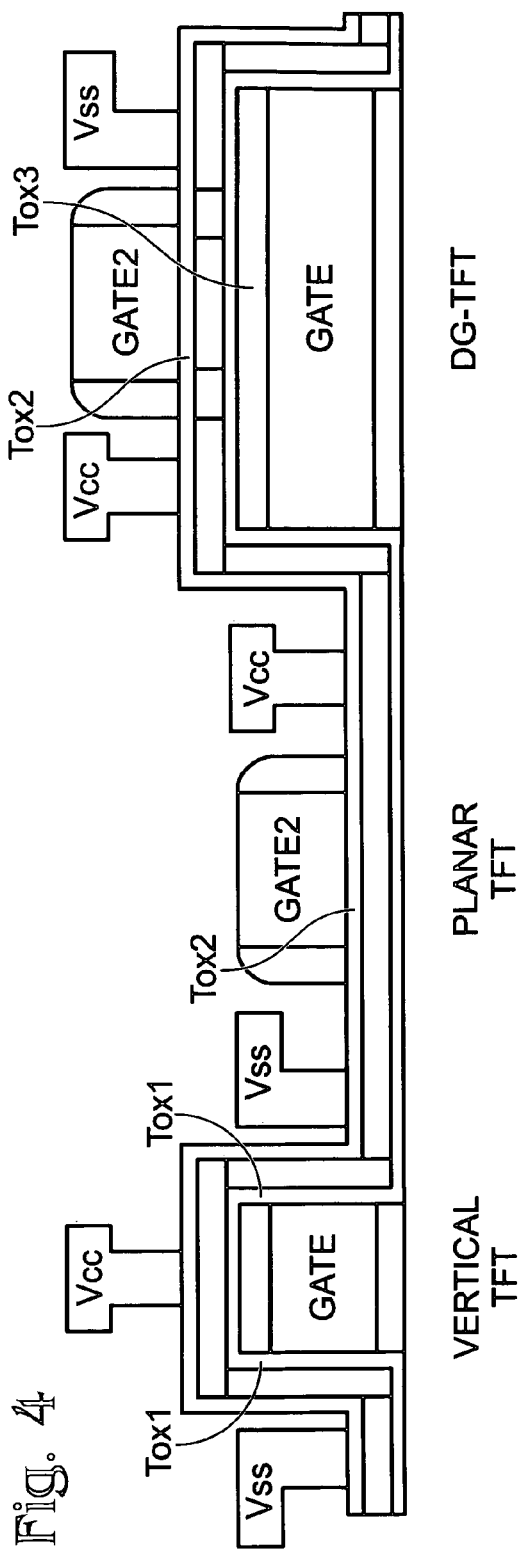
FIG. 4 is a partial cross-sectional view of the three device types that can be simultaneously fabricated.

FIG. 4 is a partial cross-sectional view of the three device types that can be simultaneously fabricated. Shown from left to right are (1) a vertical TFT transistor, (2) a planar TFT transistor and (3) a dual-gate TFT transistor, respectively. The co-integration method is described as follows:
 1. Start with the appropriate substrate (i.e. glass)
 2. Deposit basecoat (substrate insulation) layer to isolate the TFT plane from the substrate. The basecoat layer may be a single layer, for example ~200-300 nanometers (nm) of SiO2, or a layer-stack, such as 0~250 nm SiO2/10-100 nm Si3N4/30-200 nm SiO2.
 3. Deposit a gate stack consisting of two layers.
    a. Polysilicon 100 nm to 600 nm. This thickness determines the V-TFT channel length.
    b. PECVD silicon oxide ~30-150 nm thick.
 4. Dope the polysilicon gate using photo mask and ion implantation (Mask 1 & 2). Implant energy for poly-Si gate is tuned to produce the peak ion density at the center of the gate layer. Assuming a 2000 Å gate thickness, implant phosphorus with an energy of about 77 keV and boron energy of about 28 keV, to center the peak implant at 1000 Å.
 5. Anneal the stack at about 600-700 degrees C. for 1 to 10 hours to activate the dopants and densify the oxide layers.
 6. Pattern the gate stack using photolithography and plasma etch (Mask 3). In some aspects, a layer of oxide (Tox3) is deposited over the DG-TFT first gate, prior to the deposition of the first oxide layer (Step 8).

Figure 5:
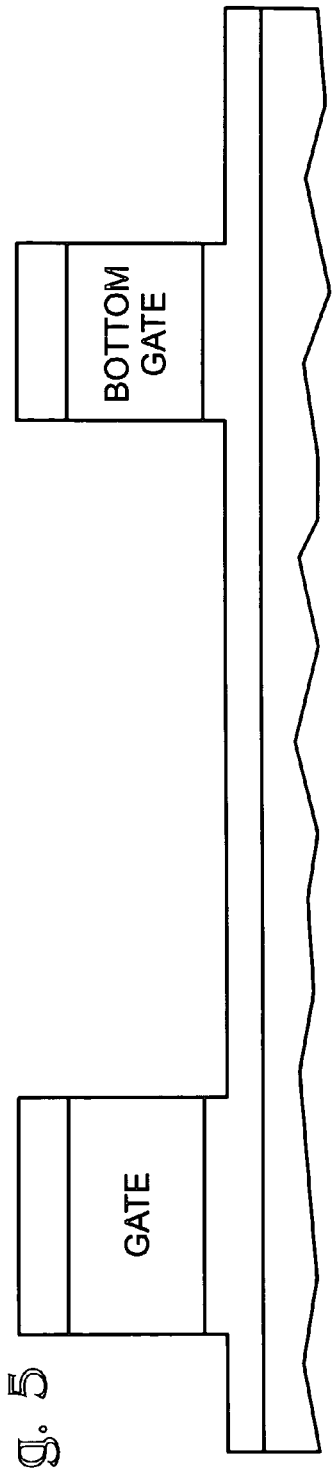

FIGS. 5 through 10 show steps in the fabrication of the devices shown in FIG. 4. FIG. 5 shows a partial cross-section of the devices after the completion of Steps 1-6.
 7. Clean the gate surface to remove polymer and contamination from plasma etch, using a sequence of RCA clean and HF.
 8. Form the gate insulation layer with electrical tox (oxide) having a thickness between 25 and 500 Å (Tox1). Many possible methods can be used including:
    a. PECVD SiO2 deposition, especially TEOS oxide.
    b. PECVD or LPCVD silicon nitride.
    c. ICP plasma (or other HDP) oxidation of the exposed polysilicon surface.
    d. Combinations of the above processes.

The key requirements for the gate oxide layer are the same as for conventional CMOS or TFT transistors. These requirements include good step coverage, low leakage current and high breakdown field, and low density of interface states.
 9. An amorphous silicon layer 300 to 1000 Å thick is deposited to form the transistor active channel.
 10. Channel Vt adjust implant can be carried out at this time using an angled implant to ensure that dopant species are implanted in the back of the active channel.
 11. Furnace anneal the structure to drive off the hydrogen in the amorphous silicon layer.
 12. Laser-anneal the active silicon layer.

Figure 6:
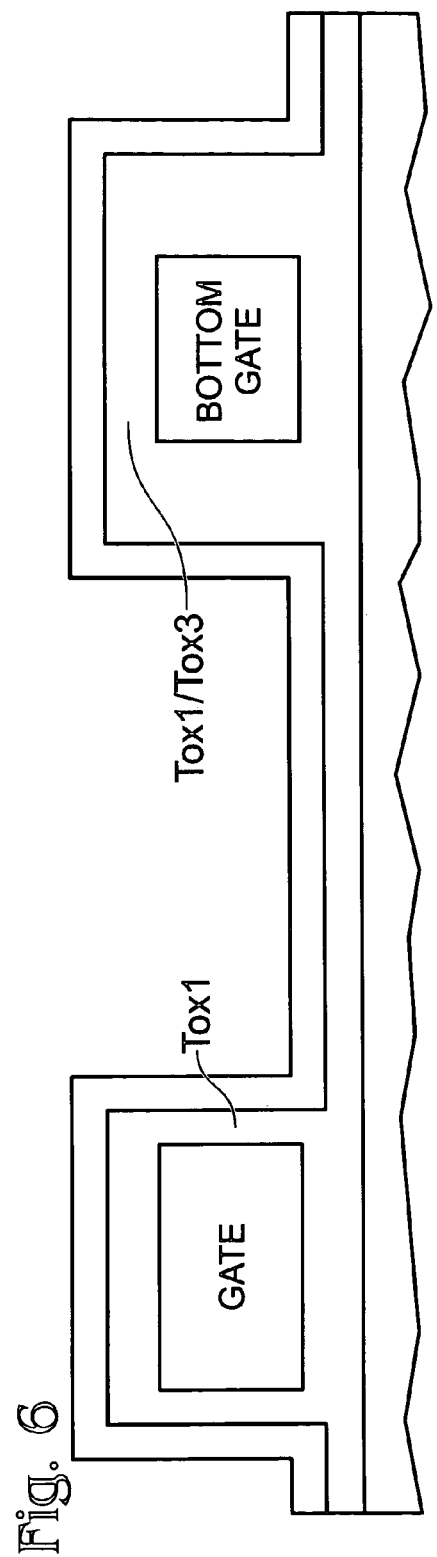

FIG. 6 depicts a cross-sectional view of the devices after the completion of Steps 7-12.
 13. Deposit the gate oxide layer for the planar devices (Tox2): 30-100 nm thick SiO2 film.
 14. Deposit gate layer for the planar devices (i.e. 200 nm poly-Si or metal layer).

15. Pattern the gate layer (Mask 4).

FIG. 7 is a partial cross-sectional view of the devices following the completion of Steps 13-15.

16. Low dose LDD implants can be carried out at this time for V-TFTs with a dose between about 5e12 and 5e13 ions/cm$^2$, and an energy level sufficient to penetrate to a depth greater than the sum of the Tox2+active layer, and less than the sum of Tox2+active layer+Tox1. It is desirable to achieve LDD implants for all types of devices (MP-TFTs and planar TFTs) to reduce the number of masking steps. For example, if 2 types of LDD implants (one for n- and one for p-) have to occur twice (one time for MP-TFTs and one time for planar TFTs), 4 lithographic steps are required. One alternative embodiment is to deposit an additional field oxide and then etch it preferentially over the V-TFT topology, using one masking step. By doing so, the overall implantation depth for both V-TFTs and the other TFTs can be equalized at the cost of one extra masking step, instead of two. The extra oxide formed over the planar TFT and DG-TFT topography can be later used in the sidewall formation step. With this variation, 3 masking steps (1 for oxide etch and 2 for LDD implants) are used instead of 4 masking steps. Note that the LDD implant, for V-TFTs, affects only the top of the structure, so high fields should not be applied to the source contact to prevent high gate-drain fields where there is no LDD implant at the lower gate edge (Masks 5-8 or Masks 5-7).

FIG. 8 is a cross-sectional view of the devices after Step 16 is completed.

17. Form sidewalls in the planar and DG-TFTs using combination of SiO2 deposition and etching steps. Typical (total) SiO2 thickness (on top of the planar TFT topography) is on the order of 300 nm for a target sidewall width of ~0.15-0.18 μm (microns).

18. Implant source/drain regions with the appropriate species using a tilt angle of 0 degrees. Implant energy is chosen to produce the appropriate doping of source drain regions without implanting too far down the active channel of the V-TFTs. The TEOS oxide layer acts as a spacer to block S/D implant from the back of the V-TFT active channel while allowing implant in the Source and Drain regions (Masks 9-10 or Masks 8-9).

Figure 9:
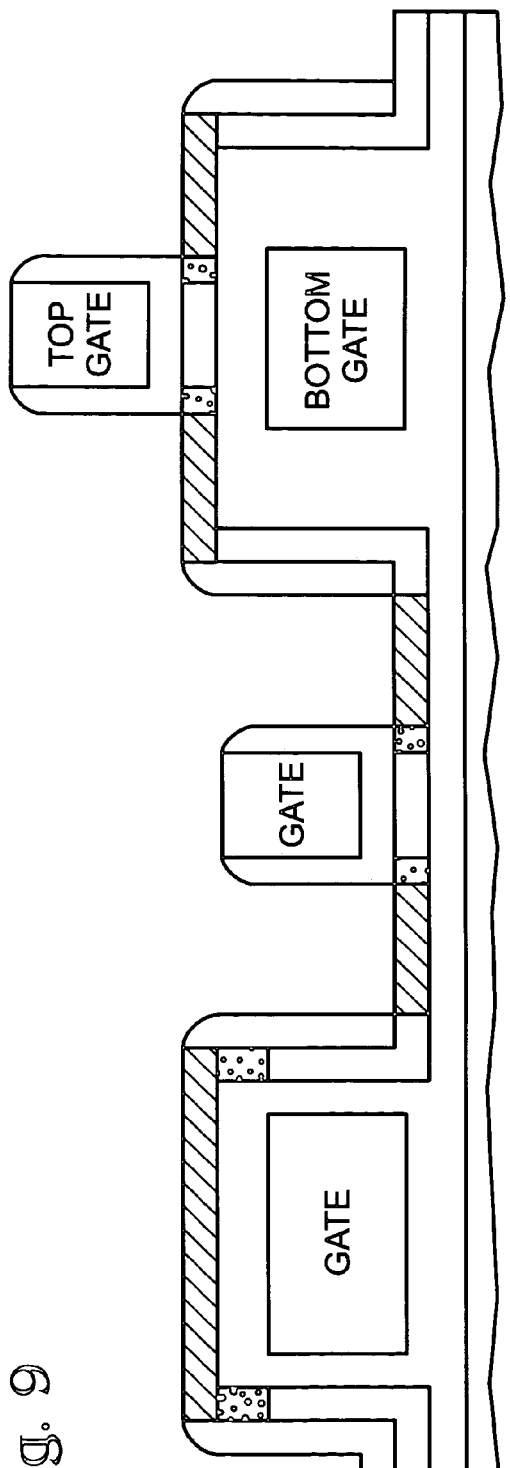

FIG. 9 depicts a cross-sectional view of the devices after the completion of Steps 17 and 18.

19. Deposit screen oxide to prevent dopant out diffusion (i.e. 500 Å TEOS SiO2)

20. Anneal the structure at about 600-700 degrees C. for 1 to 10 hours to activate the dopants.

21. Etch to remove the screening oxide layer stopping on silicon. If high value resistors are desired the screening oxide etch can be masked using photolithography to leave screening oxide over active area silicon to prevent silicide formation. These devices are often used as current limiting resistors in I/O circuits and for analog voltage reference circuits.

22. The active silicon and poly gate surfaces can be silicided using a self-aligned process at this point, but salicide is not required. Briefly the salicide process is:

Deposit TEOS oxide spacer 2000 to 5000 Å thick
   Spacer etch
   Deposit metal (Ti, Ni or Co) for silicide
   Anneal to form silicide
   Peroxide based wet etch to remove un-reacted metal.
   Anneal to stabilize the silicide.

Figure 10:
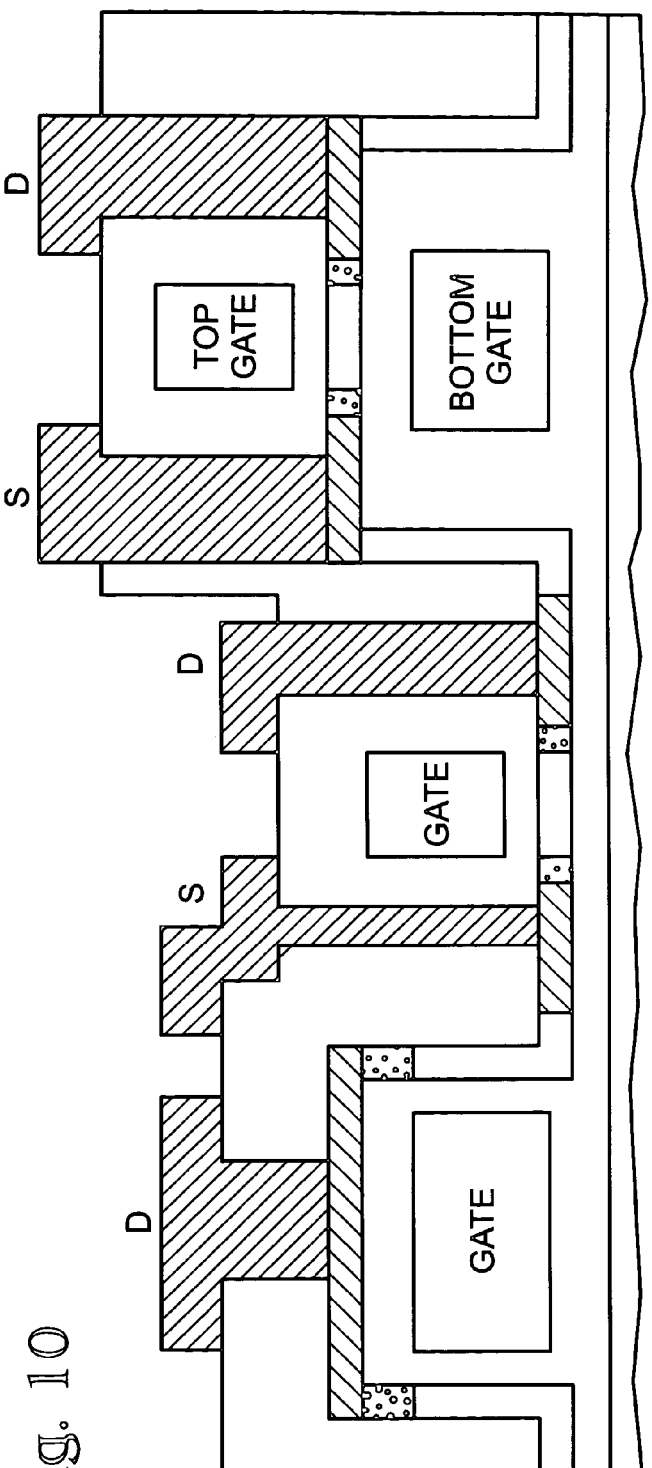

FIG. 10 is a cross-sectional depiction of the devices following a conventional backend process flow for isolation, contacts, and metal interconnects.

The application possibilities of this co-integration method are quite versatile, as far as type and complexity of components that can be built monolithically on a panel. The dual-gate devices can be used in circuits that demand precise Vth control. The bottom gate can be used to regulate the Vth of the top-gate device and such control can be enabled via a feedback loop that regulates the characteristics of a plurality of such devices based on a control signal. Hence, dual gate devices are anticipated to find application in Vth-critical circuits, such as analogue circuits including A-D converters, DC-DC converters, and the like. Vertical TFTs can find application in a variety of novel, value-adding circuits. One possibility is the addition of low-end processing function for image processing, voice processing (for I/O), RF wireless communication, and addition of memory-on-pixel.

Figure 11:
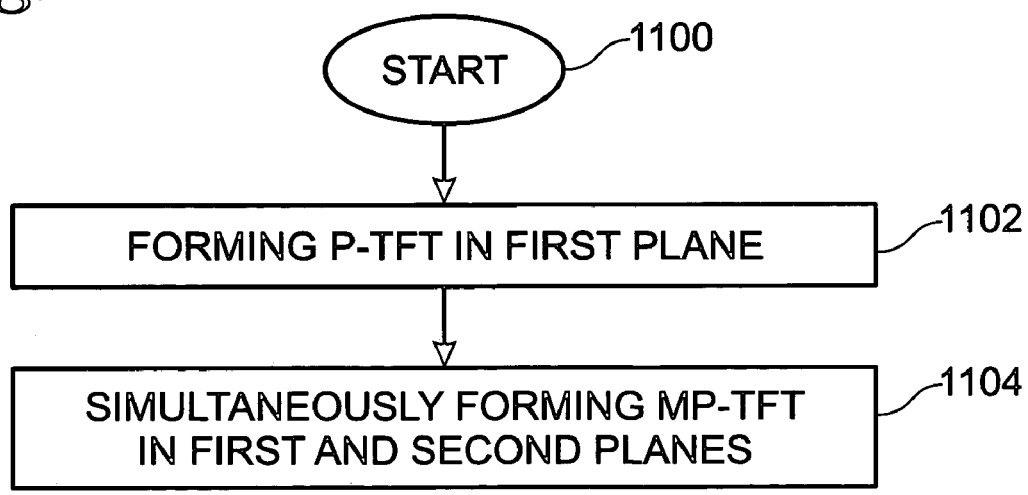
FIG. 11 is a flowchart illustrating a method for concurrently forming multi-planar thin-film transistors (MP-TFTs) and planar TFTs (P-TFTs).

FIG. 11 is a flowchart illustrating a method for concurrently forming multi-planar thin-film transistors (MP-TFTs) and planar TFTs (P-TFTs). Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 1100.

Step 1102 forms a P-TFT having source/drain (S/D) regions with top surfaces, an intervening channel region with a top surface, and a gate with a bottom surface, all in a first horizontal plane. Step 1104 simultaneously forms a MP-TFT having a first gate with a bottom surface in the first horizontal plane and at least one S/D region with a top surface in a second horizontal plane, overlying the first horizontal plane.

In some aspects, forming a MP-TFT includes forming a vertical TFT (V-TFT), the V-TFT having vertical first gate sidewalls and a vertical channel region overlying a gate sidewall. Alternately or in addition, Step 1104 forms a dual-gate TFT (DG-TFT). The DG-TFT first gate is a bottom gate. The DG-TFT has first and second S/D regions with top surfaces, an intervening channel region with a top surface, and a second, top gate with a bottom surface, all in a second horizontal plane, overlying the first horizontal plane.

FIG. 12 is a flowchart illustrating additional details of the method for concurrently forming MP-TFTs and P-TFTs. The method starts at Step 1200. Step 1202 provides a substrate made from a material such as Si, quartz, glass, or plastic. Step 1204 conformally deposits a substrate insulation layer overlying the substrate, made from a material selected from the group including SiO2, SiO2/Si3N4/SiO2, or organic insulators such as polyimide. Step 1206 forms a MP-TFT first gate overlying the substrate insulation layer. Step 1208 simultaneously forms aspects of the P-TFT and DG-TFT by conformally depositing a first oxide layer overlying the first gate and the substrate insulation layer. Step 1210 simultaneously for both the P-TFT and MP-TFTs forms an active silicon layer overlying the first oxide layer. In one aspect, Step 1210 forms an active silicon layer by conformally depositing an amorphous silicon (a-Si) layer; and crystallizing the a-Si layer. Step 1212 conformally deposits a second oxide layer overlying the active Si layer.

When the MP-TFT is a V-TFT, Step 1208 deposits a first oxide layer overlying a V-TFT first gate sidewall, which becomes the first gate oxide layer. Optionally, Step 1209 performs a channel Vt adjust implant in the active Si layer overlying the first gate sidewall of the V-TFT.

Step 1214 forms a P-TFT gate with sidewalls overlying the second oxide layer in a region adjacent the MP-TFT first gate. When the MP-TFT is a DG-TFT, the first gate formed in Step 1206 is a bottom gate. Then, Step 1214 simultaneous with the formation of the P-TFT gate, forms a second, top gate with sidewalls overlying the second oxide layer-covered first gate. The second oxide exposed (not underlying the P-TFT gate and DG-TFT top gate) is etched away.

In some aspects, Step 1216 performs a lightly doped drain (LDD) implant in the active Si regions adjacent the P-TFT gate. If the MP-TFT is a V-TFT, Step 1216 may, simultaneously with the P-TFT LDD implant, perform a LDD implant in the active Si layer overlying the first gate and in at least one active Si region adjacent the first gate. If the MP-TFT is a DG-TFT, Step 1216 may, simultaneously with the P-TFT LDD implant, perform a LDD implant in the active Si layer overlying the first gate and adjacent the second gate.

In other aspects, Step 1218 forms oxide sidewalls overlying the P-TFT gate sidewalls, and Step 1220 forms first and second S/D regions in the active Si layer adjacent the P-TFT gate, and a channel region underlying the gate. Likewise, Step 1218 may simultaneously form oxide sidewalls overlying vertical sections of the active Si layer that overlie the V-TFT first gate sidewalls. Further, Step 1218 forms oxide sidewalls overlying vertical sections of the active Si layer that overlie the DG-TFT first gate sidewalls, and forms oxide sidewalls overlying sidewalls of the second gate.

Simultaneously with forming P-TFT S/D regions, Step 1220 forms a V-TFT first S/D region in the active Si layer overlying the first gate, a second S/D region in the active Si layer adjacent the first gate, and a channel region in a vertical section of active Si layer interposed between the first and second S/D regions. Simultaneously with forming P-TFT S/D regions, Step 1220 also forms DG-TFT first and second S/D regions in the active Si layer overlying the first gate and adjacent the second gate, and a channel region overlying the first gate and underlying the second gate.

An IC with a combination of MP and planar TFTs, and an associated method for simultaneously fabricating these devices has been provided. Various process specifics have been described to clarify the invention. However, the invention is not limited to just these examples. The invention has application to a broad range of logical circuits, such as AND and NOR gates for example, and other electrical circuit devices. Other variations and embodiments of the invention will occur to those skilled in the art.

We claim:

1. A method for concurrently forming multi-planar thin-film transistors (MP-TFTs) and planar TFTs (P-TFTs), the method comprising:
   forming a P-TFT having source/drain (S/D) regions with top surfaces, an intervening channel region with a top surface, and a gate with a bottom surface, all in a first horizontal plane; and,
   simultaneously forming a MP-TFT having a first gate with a bottom surface in the first horizontal plane and at least one S/D region with a top surface in a second horizontal plane, overlying the first horizontal plane.

2. The method of claim 1 wherein forming a MP-TFT includes forming a vertical TFT (V-TFT), the V-TFT having vertical first gate sidewalls and a vertical channel region overlying a gate sidewall.

3. The method of claim 1 wherein forming a MP-TFT includes forming a dual-gate TFT (DG-TFT), the DG-TFT first gate being a bottom gate, the DG-TFT having first and second S/D regions with top surfaces, an intervening channel region with a top surface, and a second, top gate with a bottom surface, all in a second horizontal plane, overlying the first horizontal plane.

4. The method of claim 1 further comprising:
   providing a substrate;
   conformally depositing a substrate insulation layer overlying the substrate, made from a material selected from the group including SiO2, SiO2/Si3N4/SiO2, and organic insulators such as polyimide; and,
   wherein forming the MP-TFT first gate includes forming the first gate overlying the substrate insulation layer;
   wherein simultaneously forming the P-TFT and DG-TFT includes conformally depositing a first oxide layer overlying the first gate and the substrate insulation layer.

5. The method of claim 4 wherein providing a substrate includes providing a substrate made from a material selected from the group including Si, quartz, glass, and plastic.

6. The method of claim 4 wherein simultaneously forming a P-TFT and a MP-TFT includes:
   forming an active silicon layer overlying the first oxide layer; and,
   conformally depositing a second oxide layer overlying the active Si layer.

7. The method of claim 6 wherein forming an active silicon layer overlying the first oxide layer includes:
   conformally depositing an amorphous silicon (a-Si) layer; and
   crystallizing the a-Si layer.

8. The method of claim 6 wherein the MP-TFT is a V-TFT and the first oxide layer overlying a V-TFT first gate sidewall is a first gate oxide layer; and,
   wherein forming the V-TFT includes performing a channel Vt adjust implant in the active Si layer overlying the first gate sidewall.

9. The method of claim 6 wherein forming a P-TFT includes forming a gate with sidewalls overlying the second oxide layer in a region adjacent the MP-TFT first gate.

10. The method of claim 9 wherein the MP-TFT is a DG-TFT and the first gate is a bottom gate; and,
    wherein forming the DG-TFT includes forming a second, top gate with sidewalls overlying the second oxide layer-covered first gate.

11. The method of claim 1 wherein forming the P-TFT includes performing a lightly doped drain (LDD) implant in the active Si regions adjacent the P-TFT gate.

12. The method of claim 11 wherein the MP-TFT is a V-TFT; and,
    wherein forming the V-TFT includes, simultaneously with the P-TFT LDD implant, performing a LDD implant in the active Si layer overlying the first gate and in at least one active Si region adjacent the first gate.

13. The method of claim 11 wherein the MP-TFT is a DG-TFT; and,
    wherein forming the DG-TFT includes, simultaneously with the P-TFT LDD implant, performing a LDD implant in the active Si layer overlying the first gate and adjacent the second gate.

14. The method of claim 9 wherein forming the P-TFT includes:
    forming oxide sidewalls overlying the P-TFT gate sidewalls; and,
    forming first and second S/D regions in the active Si layer adjacent the P-TFT gate, and forming a channel region underlying the gate.

15. The method of claim 14 wherein the MP-TFT is a V-TFT; and, wherein forming the V-TFT includes:

simultaneously with forming P-TFT gate oxide sidewalls, forming oxide sidewalls overlying vertical sections of the active Si layer that overlie the first gate sidewalls; and, simultaneously with forming P-TFT S/D regions, forming a first S/D region in the active Si layer overlying the first gate and a second S/D region in the active Si layer adjacent the first gate, and a channel region in a vertical section of active Si layer interposed between the first and second S/D regions.

16. The method of claim 14 wherein the MP-TFT is a DG-TFT; and, wherein forming the DG-TFT includes:

simultaneously with the P-TFT forming gate oxide sidewalls, forming oxide sidewalls overlying vertical sections of the active Si layer that overlie the first gate sidewalls, and forming oxide sidewalls overlying sidewalls of the second gate; and, simultaneously with forming P-TFT S/D regions, forming first and second S/D regions in the active Si layer overlying the first gate and adjacent the second gate, and a channel region overlying the first gate and underlying the second gate.

* * * * *